(12) United States Patent
Jo

(10) Patent No.: US 10,883,170 B2
(45) Date of Patent: Jan. 5, 2021

(54) CARBON MATERIAL HAVING COATING LAYER COMPRISING TAC, AND METHOD FOR PRODUCING SAID CARBON MATERIAL

(71) Applicant: TOKAI CARBON KOREA CO., LTD, Gyeonggi-do (KR)

(72) Inventor: Dong Wan Jo, Gyeonggi-do (KR)

(73) Assignee: TOKAI CARBON KOREA CO., LTD, Gyeonggi-do (KR)

( * ) Notice: Subject to any disclaimer, the term of this patent is extended or adjusted under 35 U.S.C. 154(b) by 0 days.

(21) Appl. No.: 16/607,490

(22) PCT Filed: Apr. 27, 2018

(86) PCT No.: PCT/KR2018/004901
§ 371 (c)(1),
(2) Date: Oct. 23, 2019

(87) PCT Pub. No.: WO2018/199676
PCT Pub. Date: Nov. 1, 2018

(65) Prior Publication Data
US 2020/0140997 A1    May 7, 2020

(30) Foreign Application Priority Data

Apr. 28, 2017  (KR) .................. 10-2017-0054799

(51) Int. Cl.
*C23C 16/32*    (2006.01)
*C23C 16/56*    (2006.01)

(52) U.S. Cl.
CPC .............. *C23C 16/32* (2013.01); *C23C 16/56* (2013.01)

(58) Field of Classification Search
CPC ................................ C23C 16/32; C23C 16/56
USPC ......... 428/325, 698; 427/255, 249.1, 249.17, 427/255.23, 255.28, 255.395, 372.2, 427/374.1
See application file for complete search history.

(56) References Cited

U.S. PATENT DOCUMENTS

| | | | |
|---|---|---|---|
| 2005/0064247 A1 | 3/2005 | Sane et al. | |
| 2012/0040172 A1* | 2/2012 | Fujiwara | C30B 29/36 428/408 |
| 2013/0061800 A1* | 3/2013 | Nakamura | C30B 35/002 428/698 |

FOREIGN PATENT DOCUMENTS

| | | |
|---|---|---|
| CN | 106298448 A | 1/2017 |
| EP | 1852407 A1 | 11/2007 |
| EP | 3502309 A1 | 6/2019 |
| JP | 5696074 A | 8/1981 |
| JP | 2004084057 A | 3/2004 |

(Continued)

OTHER PUBLICATIONS

Nakamura et al "Sintered tantalum carbide coatings on graphite substrates:Highly reliable protective coatings for bulk and epitaxial growth" Applied Physics Letters 106,082108. (Year: 2015).*

(Continued)

*Primary Examiner* — Archene A Turner

(57) ABSTRACT

The present invention relates to carbon material having, on the base material, a coating layer that includes tantalum carbide (TaC), and a method for producing the carbon material. For example, the carbon material may include a base material and a coating layer on the surface of the base material. The coating layer may include TaC having average crystal grain size of 10-50 μm.

15 Claims, 6 Drawing Sheets

(56) References Cited

FOREIGN PATENT DOCUMENTS

| | | |
|---|---|---|
| JP | 2007308369 A | 11/2007 |
| JP | 2009137789 A | 6/2009 |
| JP | 2010159199 A | 7/2010 |
| JP | 2013075814 A | 4/2013 |
| KR | 20070020225 A | 2/2007 |
| KR | 20120104260 A | 9/2012 |
| KR | 20170133155 A | 12/2017 |
| KR | 20170133191 A | 12/2017 |
| WO | 2004009515 A1 | 1/2004 |
| WO | 2006/065635 A2 | 6/2006 |
| WO | 2017204534 A1 | 11/2017 |
| WO | 2017204535 A1 | 11/2017 |

OTHER PUBLICATIONS

Ali et al "Tantalum carbide film sysnthesized by hot-filament chemical vapor depostion technique" Surface & Coatings Tecghnology 206 p. 2833-2838. (Year: 2012).*
International Search Report for the International Patent Application No. PCT/KR2018/004901, dated Aug. 1, 2018, 2 pages.
European Search Report and Written Opinion for the European Patent Application No. EP18791723, dated Mar. 20, 2020, 9 pages.

* cited by examiner

CARBON MATERIAL HAVING COATING LAYER COMPRISING TAC, AND METHOD FOR PRODUCING SAID CARBON MATERIAL

CROSS REFERENCE TO RELATED APPLICATIONS

This application is a national phase claiming the benefit of and priority to International Patent Application No. PCT/KR2018/004901, entitled "CARBON MATERIAL HAVING COATING LAYER COMPRISING TAC, AND METHOD FOR PRODUCING SAID CARBON MATERIAL" filed Apr. 27, 2018, which claims priority to Korean Patent Application No. 10-2017-0054799, filed Apr. 28, 2017, which are hereby incorporated by reference in their entireties.

TECHNICAL FIELD

Example embodiments relate to a carbon material having a coating layer including tantalum carbide (TaC) that is formed on a carbon base material, and a method of manufacturing the carbon material.

BACKGROUND ART

There is ongoing research to improve abrasion resistance and corrosion resistance of a material by applying a thin film made of various materials onto a surface of a base material. The materials used for a thin film may include tantalum carbide (TaC), and coating technology using TaC is receiving a great deal of attention because it has more desirable properties in terms of heat resistance, abrasion resistance, and gas etch resistance, compared to an existing material for a thin film. Currently, a carbon material having a coating layer including TaC that is formed on a carbon base material of the carbon material is applied to and used as, for example, a member of a semiconductor single-crystal manufacturing device, a precision machine tool, an engine part, and the like in various industrial fields.

However, such coating layer including TaC may have some issue related to adhesion to a base material. Thus, there have been various attempts made by numerous entities and research institutions to form a coating layer including TaC that has a high level of adhesion onto a carbon base material.

Recently, attention is growing on technology for controlling a physical property such as hardness and surficial abrasion resistance of a coating layer including a TaC material. By estimating a required physical property of a coating layer including a TaC material based on where it is to be used and needed, and forming accordingly the coating layer including the TaC material having a required level of the physical property, such TaC material may be applied to various fields of industry. However, there has not yet been technology for precisely estimating in advance a physical property, for example, hardness and surface scratches of a coating layer including TaC, and thus it may not readily and accurately estimate or predict such property of a coating layer including TaC in a process of forming the coating layer. In addition, which variable or parameter and what degree of the variable or parameter needs to be adjusted to control surface hardness, surface scratch values, and the like remain unclear in practical uses in industrial fields.

DISCLOSURE OF INVENTION

Technical Goals

The objectives of the present disclosure are to solve such issues described above. An aspect provides a carbon material having a coating layer including tantalum carbide (TaC) that has a high level of hardness and a high surface scratch value while being highly adhesive to a carbon base material.

Another aspect also provides technology for controlling, to be a desirable level, a parameter (e.g., a type of a carbon base material, a size of a crystal grain of a coating layer including TaC, an orientation characteristic, an X-ray diffraction (XRD) intensity, and the like) that is controllable to satisfy required physical specifications of a final product, when manufacturing a carbon material having a coating layer including TaC.

However, the issues or tasks to be solved by the present disclosure are not limited to what is described above, and it is thus obvious to those skilled in the art that other tasks not described herein may also be resolved from example embodiments to be described hereinafter.

Technical Solutions

According to an example embodiment, there is provided a carbon material having a coating layer including tantalum carbide (TaC), the carbon material including a carbon base material, and the coating layer including TaC formed on a surface of the carbon base material and having an average grain size of 10 micrometers (μm) to 50 μm.

Surface hardness of the coating layer including TaC may be greater than or equal to 15 gigapascals (GPa).

A ratio of a diffraction peak value of (200) plane of the coating layer including TaC to a diffraction peak value of (111) plane of the coating layer including TaC may be less than or equal to 0.40. The diffraction peak values may be generated by X-ray diffraction (XRD) in an XRD analysis.

The peak value of (111) plane of the coating layer including TaC may be maximal among peak values generated by the XRD in the XRD analysis.

The coating layer including TaC may have a half width of a diffraction line of the XRD analysis that is less than or equal to 0.15 degrees (°).

The surface hardness of the coating layer including TaC may be represented by Equation 1 below.

$$\text{Surface hardness value (GPa)} = -38A^2 + 12A + 14 \text{ to } 17 \quad \text{[Equation 1]}$$

In Equation 1, A denotes a value obtained by dividing the diffraction peak value of (200) plane of the coating layer by the diffraction peak value of (111) plane of the coating layer in the XRD analysis.

The coating layer including TaC may have a surface scratch test value that is greater than or equal to 3.5 newtons (N).

In the carbon base material, a content of TaC contained in an area from the surface of the carbon base material up to a depth of 80 μm to 150 μm may be 15 volume percentage (vol %) to 20 vol %.

A surface scratch value of the coating layer including TaC may be represented by Equation 2 below.

$$\text{Surface scratch value (N)} = \text{content (vol \%) of TaC in an area from the surface of the carbon base material up to a depth of 80 μm to 150 μm} \times (1.4 \text{ to } 1.6) - 19.5 \quad \text{[Equation 2]}$$

A thermal expansion coefficient of the carbon base material may be $7.0 \times 10^{-6}$/K to $7.5 \times 10^{-6}$/K.

According to another example embodiment, there is provided a method of manufacturing a carbon material having a coating layer including TaC, the method including preparing a carbon base material, and forming the coating layer including TaC on the carbon base material through chemical vapor deposition (CVD) at a temperature of 1500° C. or higher.

The method may further include performing heat treatment at a temperature of 1800° C. or higher, after the forming of the coating layer including TaC.

The method may further include performing cooling after the forming of the coating layer including TaC and before the performing of the heat treatment.

The forming of the coating layer including TaC may include forming the coating layer such that the coating layer has a ratio of a diffraction peak value of (200) plane to a diffraction peak value of (111) plane satisfying Equation 1 below based on a required surface hardness value of the carbon material having the coating layer including TaC.

Surface hardness value (GPa)=$-38A^2+12A+14$ to 17  [Equation 1]

In Equation 1, A denotes a value obtained by dividing the diffraction peak value of (200) plane of the coating layer by the diffraction peak value of (111) plane of the coating layer in an XRD analysis.

The forming of the coating layer including TaC may include forming the coating layer such that the coating layer has a content of TaC satisfying Equation 2 below based on a required surface scratch value of the carbon material.

Surface scratch value (N)=content (vol %) of TaC in an area from a surface of the carbon base material up to a depth of 80 μm to 150 μm×(1.4 to 1.6)−19.5.  [Equation 2]

The preparing of the carbon base material may include preparing the carbon base material with an average porosity rate of 15 vol % to 20 vol %.

The preparing of the carbon base material may include preparing the carbon base material with a thermal expansion coefficient of $7.0\times10^{-6}$/K to $7.5\times10^{-6}$/K.

Advantageous Effects

According to an example embodiment described herein, there is provided a carbon material having a coating layer including tantalum carbide (TaC) that has a high level of hardness while being highly adhesive to a carbon base material.

According to another example embodiment described herein, in acquiring a carbon material having a coating layer including TaC, there is provided a method of manufacturing a product satisfying a required physical property, by selecting a carbon base material in a process before a manufacturing process and adjusting a diffraction peak ratio of the coating layer including TaC.

Therefore, according to the example embodiments, the carbon material having the coating layer including TaC may be applied to various sets of industrial machinery or equipment that require a material of which a physical property needs to be precisely controlled.

DETAILED DESCRIPTION

Figure 1:
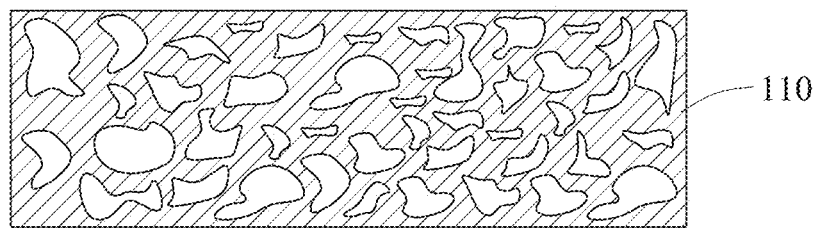
FIG. 1 is a cross-sectional conceptual view of a carbon base material including pores according to an example embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings.

The technical goals and advantageous effects are not limited to what has been described in the foregoing, and other effects may be explicitly understood by those skilled in the art from the following description. Also, in the description of example embodiments, detailed description of well-known related structures or functions will be omitted when it is deemed that such description will cause ambiguous interpretation of the present disclosure.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, examples will be described in detail with reference to the accompanying drawings, and like reference numerals in the drawings refer to like elements throughout. Also, in the description of example embodiments, detailed description of structures or functions that are thereby known after an understanding of the disclosure of the present application will be omitted when it is deemed that such description will cause ambiguous interpretation of the example embodiments.

In general, in a process of forming a coating layer with a tantalum carbide (TaC) material on a carbon material, hardness of the coated TaC layer and adhesiveness between the coated TaC layer and the carbon material used as a base material have been a major issue to be considered. Recently, research has been conducted to find various ways to improve hardness and adhesiveness of a coating layer including TaC that vary depending on various physical properties of a base material. The present disclosure is to obtain a carbon material having a coating layer including TaC that has a high level of hardness and a high level of adhesiveness to a base material by analyzing a porosity rate of the carbon material, and a crystal grain and an orientation characteristic of a TaC material.

According to an example embodiment, a carbon material having a coating layer including TaC includes a carbon base material, and the coating layer formed on a surface of the carbon base material and having an average grain size of 10 micrometers (μm) to 50 μm.

The carbon base material may be any base material including, as a main substance, carbon including graphite, for example. The coating layer including TaC may use any material including, as a main substance, tantalum (Ta) and carbon (C).

The average grain size of the coating layer including TaC may be 10 μm to 50 μm. For example, when the average grain size is less than 10 μm, hardness of the coating layer including TaC may be less than a certain level, and thus the coating layer may not be readily applicable to a semiconductor manufacturing device that generally requires a material having a relatively high level of hardness. In contrast, when the average grain size exceeds 50 μm, energy and costs required in a process for increasing a grain size may increase greatly, and productivity of a final product may be reduced accordingly.

A value of surface hardness of the coating layer including TaC may be greater than or equal to 15 gigapascals (GPa).

Thus, the coating layer including TaC may have a high level of surface hardness which is 15 GPa or greater.

In addition, a characteristic of crystallinity of the coating layer including TaC may be analyzed through an X-ray diffraction (XRD) analysis. For an XRD analysis test, general XRD analysis equipment may be used. A diffraction peak value, which is determined through the XRD analysis test and is related to a diffraction intensity, refers to a maximum peak height. In addition, a half width of a diffraction line, which refers to a diffraction peak width with respect to ½ intensity of the maximum height, may be an indicator of the crystallinity.

In an example, to form the coating layer including TaC on the carbon base material, chemical vapor deposition (CVD) may be used. In such example, it is possible to vary an XRD line pattern of the coating layer including TaC by adjusting a temperature and a pressure, and a speed of spraying each TaC precursor in a process of depositing a material including TaC.

In the coating layer including TaC, a ratio of a diffraction peak value of (200) plane to a diffraction peak value of (111) plane may be 0.40 or less. Here, the diffraction peak values are generated by XRD in the XRD analysis.

For example, when such a diffraction peak value ratio exceeds 0.40, surface hardness of the coating layer including TaC may be lowered, and thus it may not be easy to apply the coating layer to a semiconductor manufacturing device that requires a coating layer having a relatively high level of surface hardness. In addition, adhesion between the TaC coating layer and the carbon base material may be reduced, and a grain boundary forming a boundary between grains may increase, thereby reducing material homogeneity. In addition, when the diffraction peak value ratio exceeds 0.40, the surface hardness may be reduced greatly even by a slight increase in the peak value ratio. Thus, the diffraction peak value ratio of 0.40 may be a threshold value that is significant in an aspect of the present disclosure, and thus the coating layer including TaC that has the diffraction peak value ratio of 0.40 or less may be a significant factor to achieve a high level of surface hardness of the carbon material.

In addition, the diffraction peak value ratio of (200) plane to (111) plane may be 0.01 or greater. In addition, the diffraction peak value ratio of (200) plane to (111) plane may be desirably 0.19 or less to form the coating layer including TaC to have a high level of hardness.

In the coating layer including TaC, (111) plane may have a maximum peak value among peak values generated by the XRD in the XRD analysis of the coating layer including TaC.

In an XRD analysis test of the coating layer including TaC, diffraction peaks of various planes may occur due to a property of crystallinity of such TaC material. For example, diffraction lines corresponding to (220) plane, (311) plane, (111) plane, and (200) plane are formed at conspicuous intensity. Among them, (111) plane of the coating material having the coating layer including TaC may have a maximum XRD peak value.

A half width of a diffraction line of the XRD analysis of the coating layer including TaC may be 0.15 degrees (°) or less. Thus, it is possible to form the coating layer including TaC that has a high level of crystallinity and a sufficiently large average size of TaC grain.

The surface hardness of the coating layer including TaC may be represented by Equation 1 below.

$$\text{Surface hardness value (GPa)} = -38A^2 + 12A + (14 \text{ to } 17) \quad [\text{Equation 1}]$$

In Equation 1, A denotes a value obtained by dividing a diffraction peak value of (200) plane by a diffraction peak value of (111) plane of the coating layer including TaC in the XRD analysis.

Thus, the carbon material may have a close correlation between the surface hardness value and the diffraction peak value ratio of (200) plane to (111) plane of the coating layer including TaC.

When the diffraction peak value ratio between (200) plane and (111) plane of the coating layer including TaC increases, the surface hardness value of the coating layer including TaC may tend to decrease gradually. For example, when the diffraction peak value ratio between (200) plane and (111) plane of the coating layer including TaC increases, a decrement in the surface hardness value of the coating layer including TaC may increase gradually. The surface hardness value may be represented (by Equation 1) by using, as a variable, the diffraction peak value ratio between (200) plane and (111) plane based on such tendency, and determining a width of an intercept suitable for a quadric functional formula having a negative second-order coefficient.

Thus, for the carbon material having the coating layer including TaC, it is possible to precisely design a process such that an XRD peak value of the coating layer including TaC is adjusted appropriately using Equation 1 based on a required surface hardness value of a product, when manufacturing the carbon material. Thus, it is possible to form such TaC coating layer having a desired level of physical property.

The coating layer including TaC may have a surface scratch test value of 3.5 newtons (N) or greater.

To verify a desirable level of adhesion of the coating layer including TaC, various testing methods including, for example, a 4-point bending test, a peel-off test, a scotch tape test, and a direct full off test, may be used. Among these various tests, a scratch test, which is performed to verify a level of adhesion of a thin-film coating layer, may be generally used in a related industrial field because it is easy to prepare a specimen or sample and measure adhesion in a simple and convenient way. The scratch test may be performed by moving a substrate while increasing a load onto a surface of a thin film using a round-tip stylus, and calculating a level of adhesion using a threshold load value when the thin film is peeled off. Thus, an increase in a scratch value may indicate an increase in a level of adhesion. The coating layer including TaC of the carbon material may have a surface scratch value of 3.5N or greater. For example, when the surface scratch value of the coating layer including TaC is less than 3.5N, a force of adhesion to the surface of the base material may become insufficient, and thus the coating layer may not be readily applicable to an industrial use. The surface scratch value of the coating layer including TaC may be desirably 6.5N or greater. In addition, the surface scratch value of the coating layer including TaC may be more desirably 8.0N or greater. The surface scratch value may tend to increase on average as a content of TaC contained in an area from the surface of the carbon base material up to a depth of 80 μm to 150 μm increases. The content of TaC may be determined as air pores of the carbon base material are impregnated with TaC. Here, when an average porosity rate of the area from the surface of the carbon base material up to the depth of 80 μm to 150 μm increases, the force of adhesion between the coating layer including TaC and the carbon base material may also increase.

In the carbon base material, an amount of TaC contained in the area from the surface of the carbon base material up to the depth of 80 μm to 150 μm may be 15 volume percentage (vol %) to 20 vol %.

FIG. 1 is a cross-sectional conceptual view of a carbon base material 110 according to an example embodiment. The carbon base material is a porous carbon material including air pores therein. When a coating layer including TaC is formed on the carbon base material, the air pores are impregnated with TaC or a TaC component, and thus a TaC-impregnated area is generated.

Figure 2:
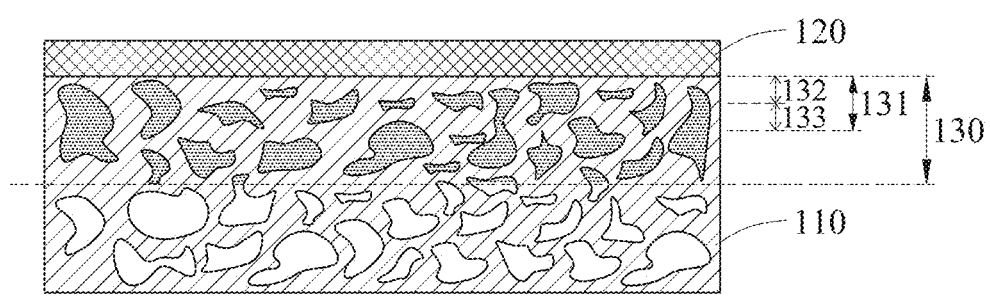
FIG. 2 is a cross-sectional conceptual view of a carbon material having a coating layer including tantalum carbide (TaC) formed on a carbon base material according to an example embodiment.

FIG. 2 is a cross-sectional conceptual view of a highly hard TaC coating carbon material including a carbon base material 110 including a TaC impregnated area 130 and a coating layer 120 including TaC formed on the carbon base material 110. The impregnated area 130 includes an area 131 from a surface of the carbon base material up to a depth of 80 μm to 150 μm. This area from the surface of the carbon base material up to the depth of 80 μm to 150 μm may be formed when air pores of the carbon base material are impregnated with TaC, or a TaC component, of the coating layer including TaC, and may affect surface hardness of the coating layer and adhesion of the coating layer to the carbon base material.

For example, a content of TaC in the area from the surface of the carbon base material up to the depth of 80 μm to 150 μm may be 15 vol % to 20 vol %. For example, when the content of TaC in the area is 15 vol % to 20 vol %, the coating layer including TaC may have a desirable level of adhesion to the carbon base material. However, when the content of TaC is less than 15 vol %, the adhesion of the coating layer including TaC may be degraded, or the surface hardness may be lowered. In contrast, when the content of TaC exceeds 20 vol %, graphite pores may be excessively formed, and surface roughness may increase and a surface of the coating layer may become rough accordingly. The content of TaC in the area may be desirably 16.5 vol % to 20 vol %. In addition, the content of TaC in the area may be more desirably 18 vol % to 20 vol %. Herein, an increase in the content of TaC may indicate a higher porosity rate of the carbon base material. In a case of a material in which a coating layer including TaC formed on a carbon base material with a high level of porosity, the material may have a more desirable level of adhesion and surface hardness.

As illustrated in FIG. 2, the area 131 from the surface of the carbon base material up to the depth of 80 μm to 150 μm includes a first area 132 which is a relatively shallow area from the surface of the carbon base material and a second area 133 which is relatively deep area from the surface. These areas have different TaC contents.

The first area is a layer adjacent to the coating layer including TaC, and where pores of the carbon base material are sufficiently impregnated with a TaC component. Thus, the first area may have a highest impregnation rate in the carbon base material. Here, adhesion and surface hardness of the coating layer including TaC formed on the carbon base material may vary depending on a process condition, for example, a process temperature and a Ta/C ratio. For example, when a content of TaC in the first area generated as a result of forming the coating layer including TaC is 16 vol % to 20 vol %, a desirable level of surface harness may be achieved. The second area is a layer adjacent to the first area, being deeper from the surface of the carbon base material than the first area, and thus the second area may be where the pores are relatively less impregnated with the TaC component. However, a content of TaC in the second area may also affect adhesion and surface hardness of the coating layer including TaC formed on the carbon base material. For example, when the content of TaC in the second area is 13 vol % to 18 vol %, the coating layer including TaC formed on the carbon base material may have a desirable level of adhesion and surface hardness. The contents of TaC in the first area and the second area may change gradually. A boundary between the first area and the second area may be formed in a depth of 40 μm to 70 μm from the surface of the coating layer including TaC of the carbon material.

According to an example embodiment, a surface scratch value of the coating layer including TaC may be represented by Equation 2 below.

$$\text{Surface scratch value (N)} = \text{TaC content (vol \%) in an area from a surface of a carbon base material up to a depth of 80 μm to 150 μm} \times (1.4 \text{ to } 1.6) - 19.5 \quad \text{[Equation 2]}$$

There are various factors that determine adhesion of the coating layer including TaC formed on the carbon base material to the carbon base material. Among them, a TaC content included in the area from the surface of the carbon base material up to 80 μm to 150 μm in depth may greatly affect the adhesion of the coating layer including TaC. The surface scratch value N may be represented by an equation of a linear function having, as a variable, the TaC content (vol %) in the area from the surface of the carbon base material up to the depth of 80 μm to 150 μm.

The surface scratch value N of the coating layer including TaC that is determined based on such equation may be a value obtained by the TaC content (vol %) in the area from the surface of the carbon base material up to the depth of 80 µm to 150 µm×(1.4 to 1.6)−19.5.

In addition, a thermal expansion coefficient of the carbon base material may be $7.0×10^{-6}$/K to $7.5×10^{-6}$/K.

The thermal expansion coefficient of the carbon base material may be another important factor to determine the adhesion between the carbon base material and the coating layer including TaC formed on the carbon base material. By considering a thermal expansion coefficient of the coating layer including TaC, a carbon base material having a thermal expansion coefficient that is not, or less or least, different from that of such a TaC material may need to be prepared to form the carbon material having the coating layer including TaC according to an example embodiment. Here, the thermal expansion coefficient of the carbon base material may be $7.0×10^{-6}$/K to $7.5×10^{-6}$/K. Thus, in case of expansion or contraction due to a change in temperature of the coating layer including TaC, it is possible to minimize a thermal stress with the carbon base material and improve adhesiveness of the coating layer.

Figure 3:
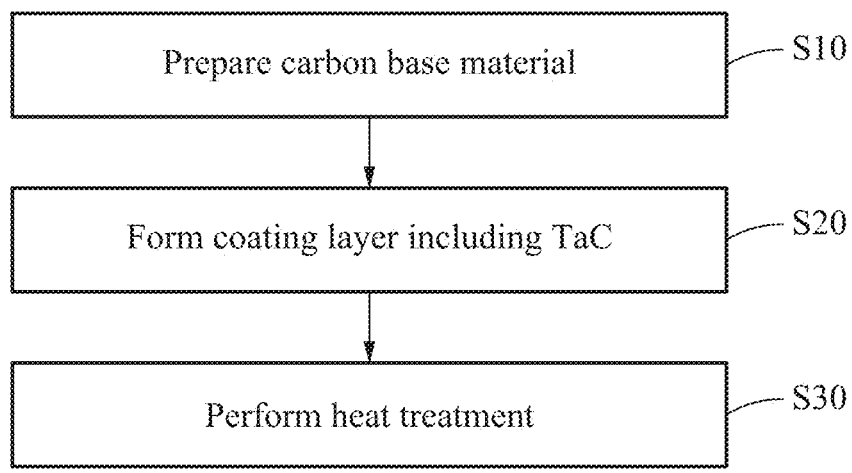
FIG. 3 is a flowchart illustrating a method of manufacturing a carbon material having a coating layer including TaC according to an example embodiment.

FIG. 3 is a flowchart illustrating a method of manufacturing a carbon material having a coating layer including TaC according to an example embodiment.

The method of manufacturing the carbon material having the coating layer including TaC includes a step of preparing a carbon base material, a step of forming the coating layer including TaC on the carbon base material through CVD at a temperature of 1500° C. or higher.

A general deposition method using the CVD that is applied to a TaC material may include performing a deposition process in a chamber while maintaining a temperature of 800° C. to 900° C. in the chamber, or performing the deposition process by injecting a raw or base gas first at a temperature of hundreds ° C. and then gradually increasing the temperature in the chamber.

However, according to an example embodiment, the CVD may be performed at a high initial temperature of 1500° C. or higher, and performed afterwards isothermally. Thus, it is possible to achieve a high level of adhesion to the carbon base material and a high level of surface hardness. However, the temperature may be less than 2500° C. When the temperature exceeds 2500° C., it may not be easy to implement a device or equipment, and such a high temperature may prevent a TaC component from being immersed in air pores of the carbon base material and may thus reduce the adhesion.

After the step of forming the coating layer including TaC, the method further includes a step of performing heat treatment at a temperature of 1800° C. or higher.

After the step of forming the coating layer including TaC through the CVD at such a high temperature, the heat treatment may be additionally performed by increasing a temperature in the chamber after injecting a base gas. The heat treatment may be performed to reduce a residual stress, promote a growth of a grain size, and form a more homogeneous coating layer, and thereby improving a physical property of the coating layer including TaC for a final product.

The method may further include a step of cooling to be performed between the step of forming the coating layer including TaC and the step of performing the heat treatment. The cooling may be performed to cool a surface of the TaC coating layer or cool the carbon material entirely. The cooling may include taking the carbon material out of the chamber and significantly reducing the temperature to a room temperature, or slightly reducing the temperature to be less than the temperature at which the step of forming the coating layer including TaC is performed.

The step of forming the coating layer including TaC may include forming the coating layer including TaC based on a required surface hardness value of the carbon material having the coating layer including TaC such that a ratio of a diffraction peak value of (200) plane to a diffraction peak value of (111) plane of the coating layer satisfies Equation 1 below.

Surface hardness value (Gpa)=$-38A^2+12A+14$ to 17  [Equation 1]

In Equation 1, A denotes a value obtained by dividing the diffraction peak value of (200) plane of the coating layer including TaC by the diffraction peak value of (111) plane of the coating layer including TaC, in an XRD analysis.

For the carbon material having the coating layer including TaC, it is possible to precisely design a process to adjust an XRD peak value of the coating layer including TaC based on a required surface hardness value of a final product, using Equation 1, when manufacturing the carbon material. Thus, it is possible to achieve a desirable level of surface harness of the coating layer including TaC to be generated, and thus obtain a final product satisfying a desirable specification of surface hardness by adjusting a ratio between a diffraction peak value of (200) plane of the coating layer including TaC and a diffraction peak value of (111) plane of the coating layer.

The step of forming the coating layer including TaC may be performed such that the coating layer including TaC has a TaC content that satisfies Equation 2 below based on a required surface scratch value of the carbon material having the TaC coating layer.

Surface scratch value (N)=TaC content (vol %) in an area from a surface of a carbon base material up to a depth of 100 µm×(1.4 to 1.6)−19.5  [Equation 2]

The step of preparing the carbon base material may include preparing a carbon base material having an average porosity rate of 15 vol % to 20 vol %.

To form, on the carbon base material, the coating layer including TaC that is desirably adhesive, the carbon base material having the average porosity rate of 15 vol % to 20 vol % may be prepared. By preparing the carbon base material having the average porosity rate of 15 vol % to 20 vol %, it is possible to form the coating layer including TaC that has a desirable level of adhesion and surface hardness which are effects to be expected from the present disclosure. The average porosity rate may be desirably 16.5 vol % to 20 vol %, and more desirably 18 vol % to 20 vol %. Here, an increase in the TaC content in the carbon base material may indicate a relatively higher porosity rate of the carbon base material. A material having a TaC coating layer on a carbon base material with a relatively high porosity rate may have a more desirable level of adhesion and surface hardness. The average porosity rate of the carbon base material may be measured through mercury porosimetry using a porosimeter.

The step of forming the coating layer including TaC includes impregnating pores of the carbon base material with a component of the coating layer including TaC, and forming an impregnated area in the carbon base material that is in contact with the coating layer. When the coating layer is formed on the carbon base material at a high temperature, the component of the coating layer including TaC starts permeating the carbon base material, starting from pores on a surface layer up to pores inside the carbon base material. Thus, the impregnated area being in contact with the coating layer is formed inside the carbon base material. An area from the surface of the carbon base material up to the depth of 80 µm to 150 µm in the impregnated area may be significant to determine adhesion between the coating layer including TaC and the carbon base material and surface hardness of the carbon material.

The step of preparing the carbon base material includes preparing a carbon base material having a thermal expansion coefficient of $7.0 \times 10^{-6}$/K to $7.5 \times 10^{-6}$/K.

When considering a thermal expansion coefficient of the coating layer including TaC, a carbon base material having a thermal expansion coefficient that is not, or less or least, different from that of such TaC material may need to be prepared to form the carbon material having the coating layer including TaC according to an example embodiment.

Example

A plurality of carbon materials each having a coating layer including TaC with an XRD peak value was prepared through CVD.

A TaC coating layer was formed on a carbon base material with a diameter of 400 millimeters (mm) and a thickness of 10 mm under a CVD processing condition. Here, carbon base materials each having an average porosity rate of 15 vol % or greater measured in an area from a surface of a carbon base material up to a depth of 100 µm was used. In addition, a composition ratio of C/Ta of tantalum carbide coated film was 1:1.05. The average porosity rate of each carbon base material was measured through mercury porosimetry.

(1) Verification of a Relationship Between a Peak Value Ratio in an XRD Analysis and Surface Hardness of a Coating Layer Prepared under the condition were a plurality of examples and a comparative example in which a diffraction peak value ratio of (200) plane of the coating layer including TaC to (111) plane of the coating layer including TaC differs in each of the examples, and surface hardness of each of the examples was measured.

TABLE 1

|  | Peak value ratio of (200) plane to (111) plane | Surface hardness (GPa) |
|---|---|---|
| Comparative Example 1 | 0.76 | 2.64 |
| Example 1 | 0.36 | 15.36 |
| Example 2 | 0.17 | 16.31 |
| Example 3 | 0.07 | 16.78 |

Figure 4:
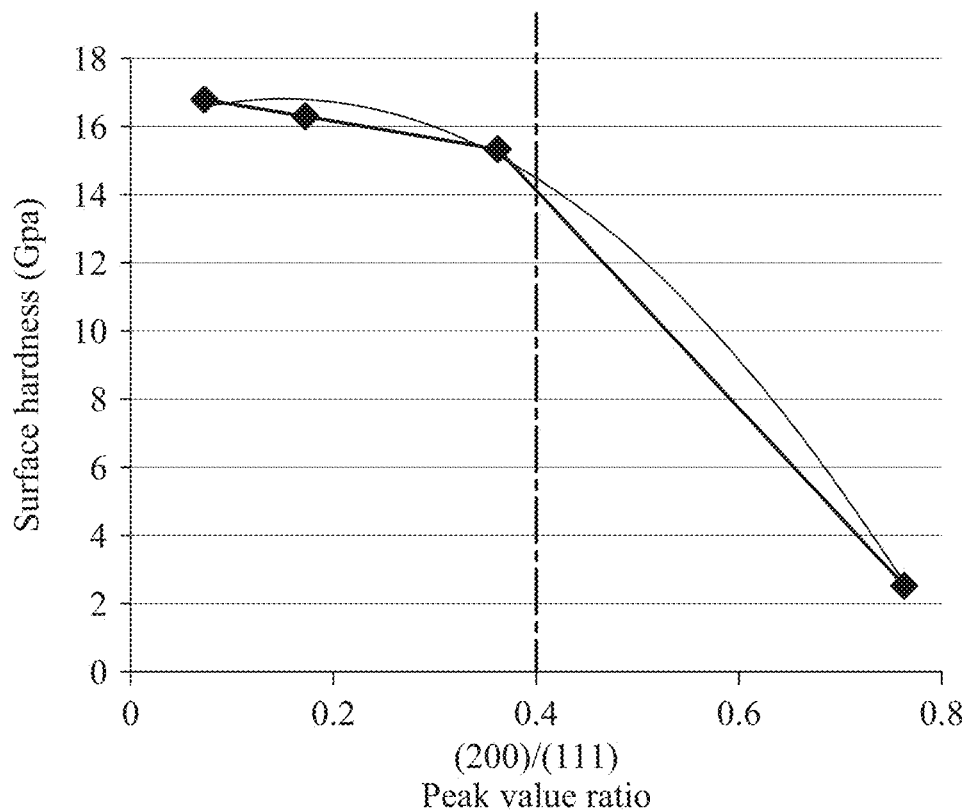
FIG. 4 is a graph illustrating a correlation between a surface hardness value and a ratio of a diffraction peak value of (200) plane to a diffraction peak value of (111) plane through an X-ray diffraction (XRD) analysis according to an example embodiment.

FIG. 4 is a graph illustrating a correlation between a surface hardness value and a ratio of a diffraction peak value of (200) plane to a diffraction peak value of (111) plane through an XRD analysis according to an example embodiment.

Referring to the graph of FIG. 4, it is verified that a surface hardness value changes greatly around a diffraction peak value ratio of 0.40. That is, when the peak value ratio is less than 0.4, the coating layer including TaC may be formed to have a high level of surface hardness, for example, a surface hardness value of 15 Gpa or greater as indicated. It is also verified that, when the peak value ratio is less than 0.4, a slight increase in the peak value ratio results in a great decrease in the surface hardness value. In addition, as the peak value ratio gradually decreases in an interval in which the peak value ratio is less than 0.1, a rate of an increase in the surface hardness value decreases gradually.

In addition, through the analysis, it is verified that, between the diffraction peak value ratio and the surface hardness value, a correlation of a quadratic function using, as a variable, the diffraction peak value ratio, and having all surface hardness values within an error range is established. The correlation is as represented by Equation 1 above.

(2) Verification of a Relationship Between an Average Porosity Rate of a Carbon Base Material and a Surface Scratch Value of a TaC Coating Layer A scratch test was performed on each of the carbon materials each having the coating layer including TaC prepared by varying an average porosity rate of a carbon base material under the condition. Table 2 below indicates results obtained from the surface scratch test performed on the carbon materials each having the coating layer including TaC based on an average porosity rate of a carbon base material.

TABLE 2

|  | Average porosity of carbon base material (vol %) | Surface scratch value (N) |
|---|---|---|
| Example 4 | 18.7 | 8.47 |
| Example 5 | 16.9 | 5.48 |
| Example 6 | 15.5 | 3.71 |

It is verified, as indicated by Examples 4 through 6, that, when an average porosity rate of a carbon base material is 15 vol % or greater, a surface scratch value is 3.5N or greater.

Thus, it is verified that, in a case of a carbon base material having an average porosity rate less than 15 vol %, a desirably high level of adhesion may be not achieved. In addition, by securing an average porosity rate greater than or equal to a preset level for the carbon base material, the scratch value of 3.5N or greater may be achieved. Through the results of the test, it is also verified that, as the average porosity rate of the carbon base material increases, the adhesion of the TaC coating layer onto the carbon base material may also increase. Thus, it is verified that, between the average porosity rate of the carbon base material and the scratch value of the TaC coating layer formed on the carbon base material, a correlation of a linear function using, as a variable, the surface scratch value of the TaC coating layer formed on the carbon base material is established. The correlation is as represented by Equation 2 above.

(3) Verification of a Relationship Between an Average Grain Size of a Coating Layer Including TaC and Surface Hardness Prepared under the condition were a plurality of examples and a comparative example by varying an average grain size, to verify a relationship between an average grain size of a coating layer including TaC and surface hardness, and surface harness was measured from each example.

An average grain size of the coating layer including TaC was measured according to ASTM E112, which is a standard test method used to determine an average grain size.

Table 3 below indicates average grain sizes and surface hardness values measured from the examples.

TABLE 3

|  | Average grain size (µm) | Surface hardness (GPa) |
|---|---|---|
| Comparative Example 2 | 6.1 | 2.64 |
| Example 7 | 11.2 | 15.36 |
| Example 8 | 11.6 | 16.31 |
| Example 9 | 17.5 | 16.11 |
| Example 10 | 20.1 | 16.78 |

Referring to Table 3, it is verified through results indicated above that, when the average grain size increases to a preset size or greater, there is an interval in which the surface harness value increases greatly.

FIGS. 5a through 5e are scanning electron microscope (SEM) images of surfaces of coating layers including TaC in carbon materials manufactured as examples and a comparative example.

Figure 5A:
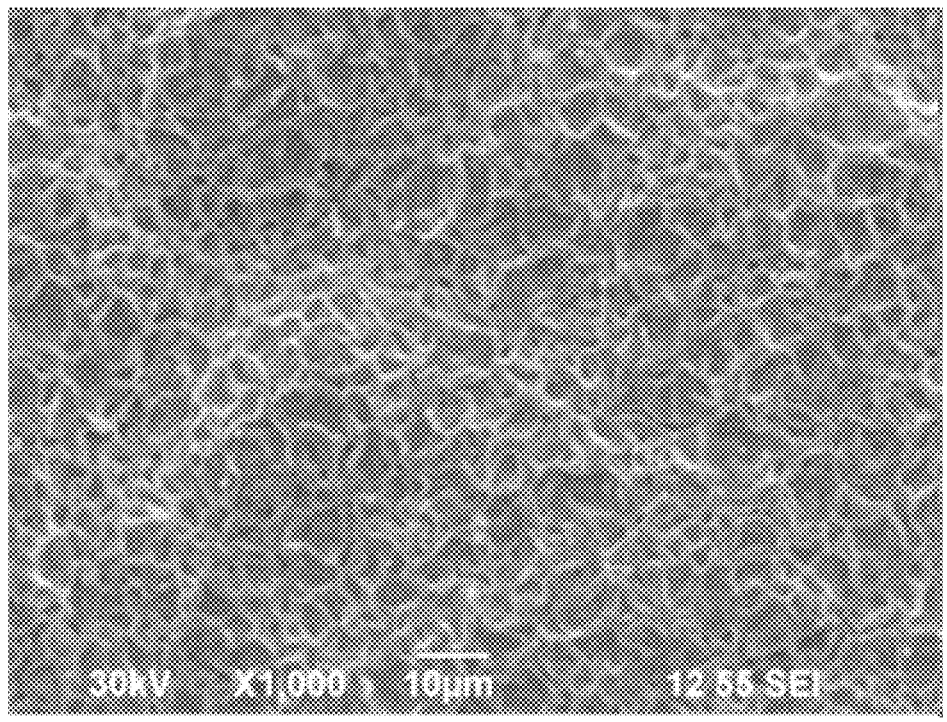
FIGS. 5a through 5e are scanning electron microscope (SEM) images of surfaces of coating layers including TaC in carbon materials manufactured as examples and a comparative example.
Figure 5B:
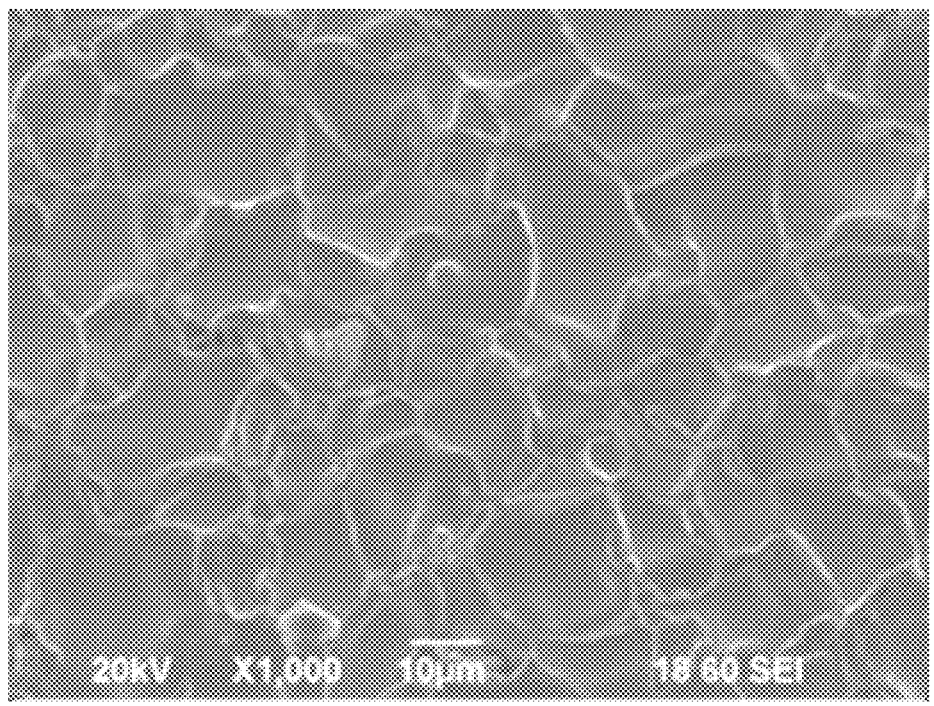
Figure 5C:
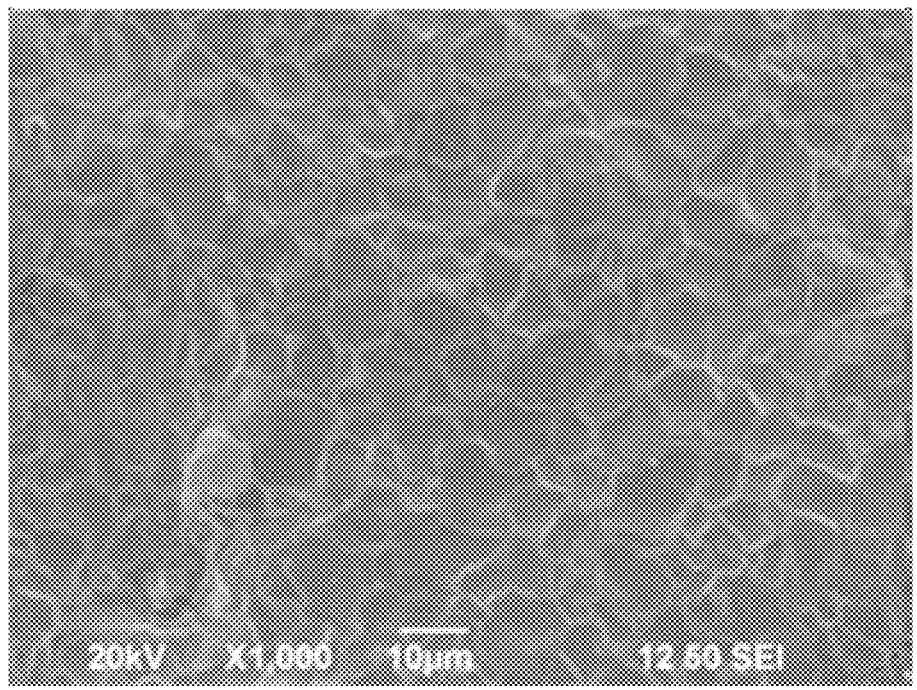
Figure 5D:
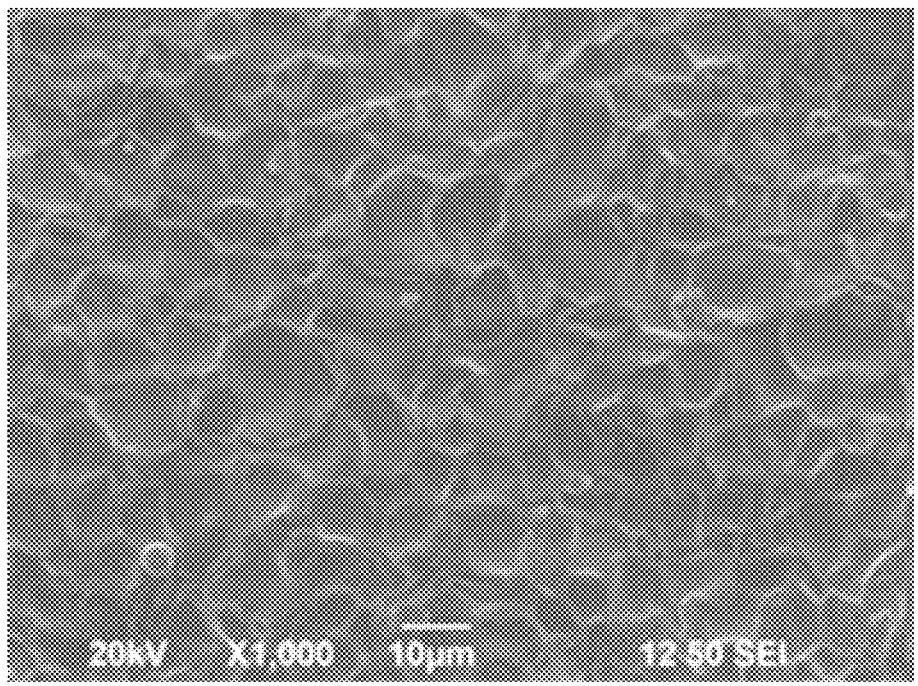
Figure 5E:
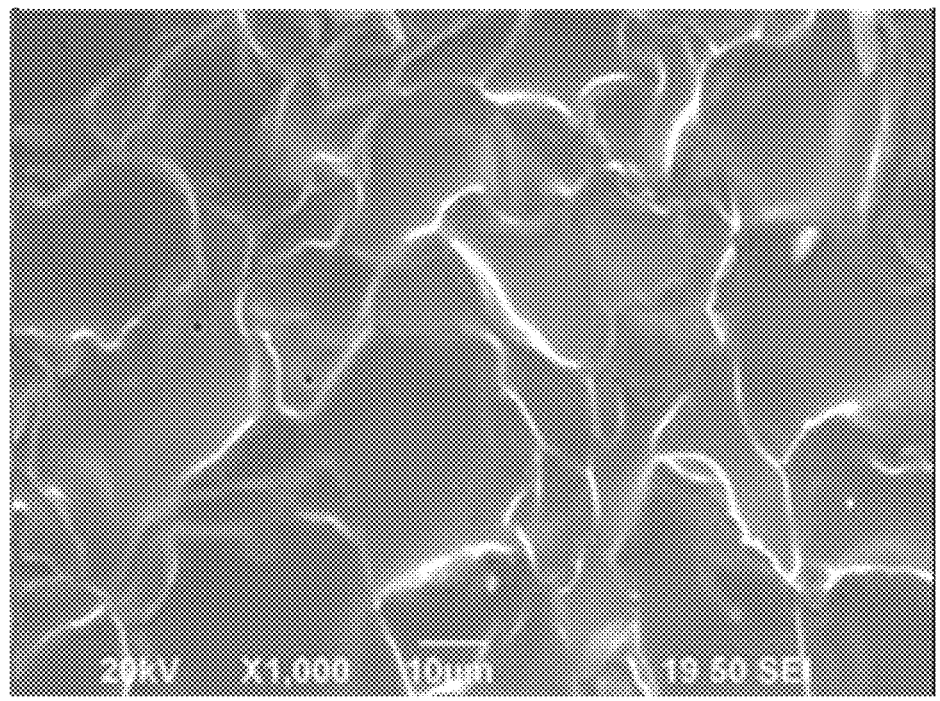

FIG. 5a is an SEM image of a surface of a coating layer including TaC of comparative example 2. FIG. 5b is an SEM image of a surface of a coating layer including TaC of example 7. FIG. 5c is an SEM image of a surface of a coating layer including TaC of example 8. FIG. 5d is an SEM image of a surface of a coating layer including TaC of example 9. FIG. 5e is an SEM image of a surface of a coating layer including TaC of example 10.

Figure 6:
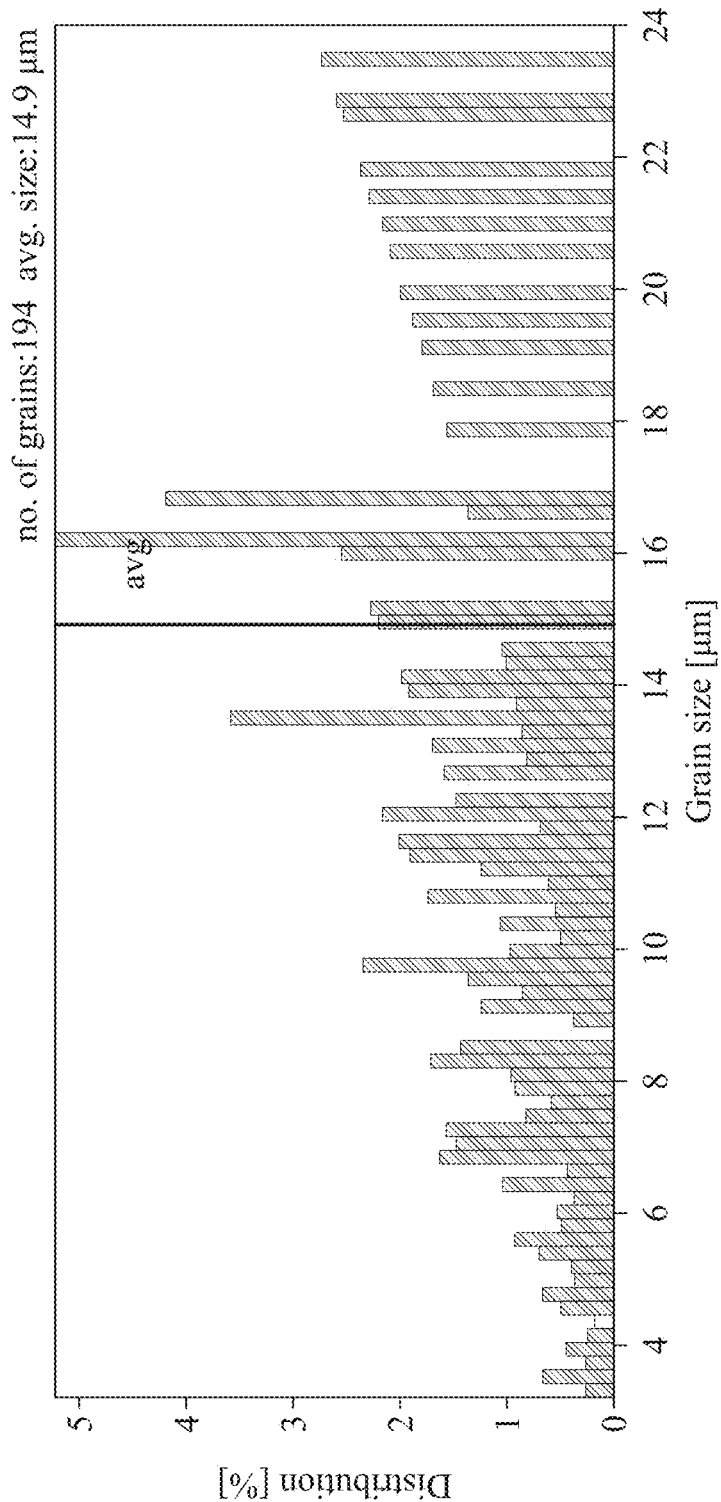
FIG. 6 is a graph illustrating a result of measuring, according to ASTM E112 Standard Test Methods for Determining Average Grain Size, an average grain size of one sample of carbon materials each having a coating layer including TaC that are manufactured according to an example embodiment.

FIG. 6 is a graph illustrating a result of measuring, according to ASTM E112 Standard Test Methods for Determining Average Grain Size, an average grain size of one sample of carbon materials each having a coating layer including TaC that are manufactured according to an example embodiment.

Referring to FIG. 6, a sample (Example 11) has an average grain size of 14.9 μm.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. A carbon material having a coating layer including tantalum carbide (TaC), the carbon material comprising:
a carbon base material; and
the coating layer including TaC formed on a surface of the carbon base material and having an average grain size of 10 micrometers (μm) to 50 μm, and
wherein a ratio of a diffraction peak value of a (200) plane of the coating layer including TaC to a diffraction peak value of a (111) plane of the coating layer including TaC does not exceed a ratio threshold value of 0.40,
wherein diffraction peak values are generated by X-ray diffraction (XRD) in an XRD analysis, and
wherein the diffraction peak value of the (111) plane of the coating layer including TaC is a maximum XRD peak value generated by XRD in the XRD analysis.

2. The carbon material of claim 1, wherein a surface hardness of the coating layer including TaC is greater than or equal to 15 gigapascals (GPa).

3. The carbon material of claim 1, wherein the coating layer including TaC has a half width of a diffraction line of an XRD analysis that is less than or equal to 0.15 degrees.

4. The carbon material of claim 1, wherein a surface hardness of the coating layer including TaC is represented by the following equation:

Surface hardness value (GPa)=$-38A^2+12A+14$ to 17, wherein A denotes a value obtained by dividing a diffraction peak value of a (200) plane of the coating layer by a diffraction peak value of a (111) plane of the coating layer in an XRD analysis.

5. The carbon material of claim 1, wherein the coating layer including TaC has a surface scratch test value that is greater than or equal to 3.5 newtons (N).

6. The carbon material of claim 1, wherein, in the carbon base material, a content of TaC contained in an area from the surface of the carbon base material up to a depth of 80 μm to 150 μm is 15 volume percentage (vol %) to 20 vol %.

7. The carbon material of claim 1, wherein a surface scratch value of the coating layer including TaC is represented by the following equation:

Surface scratch value (N)=content (vol %) of TaC in an area from the surface of the carbon base material up to a depth of 80 μm to 150 μm×(1.4 to 1.6) −19.5.

8. The carbon material of claim 1, wherein a thermal expansion coefficient of the carbon base material is $7.0\times10^{-6}$/K to $7.5\times10^{-6}$/K.

9. A method of manufacturing a carbon material having a coating layer including tantalum carbide (TaC), the method comprising:
preparing a carbon base material;
forming the coating layer including TaC on the carbon base material through chemical vapor deposition (CVD) at a temperature of 1500° C. or higher such that the coating layer has a ratio of a diffraction peak value of a (200) plane to a diffraction peak value of a (111) plane not exceeding a ratio threshold value of 0.40.

10. The method of claim 9, further comprising:
performing heat treatment at a temperature of 1800° C. or higher, after the forming of the coating layer including TaC.

11. The method of claim 10, further comprising:
performing cooling after the forming of the coating layer including TaC and before the performing of the heat treatment.

12. The method of claim 9, wherein
the forming of the coating layer such that the coating layer has the ratio of the diffraction peak value of the (200) plane to the diffraction peak value of the (111) plane satisfies an equation based on a required surface hardness value of the carbon material having the coating layer including TaC,
wherein the equation is:

Surface hardness value (GPa)=$-38A^2+12A+14$ to 17, wherein A denotes a value obtained by dividing the diffraction peak value of the (200) plane of the coating layer by the diffraction peak value of the (111) plane of the coating layer in an X-ray diffraction (XRD) analysis.

13. The method of claim 9, wherein the forming of the coating layer including TaC comprises:
forming the coating layer such that the coating layer has a content of TaC satisfying an equation based on a required surface scratch value of the carbon material, wherein the equation is:

Surface scratch value (newton [N])=content (volume percentage [vol %]) of TaC in an area from a surface of the carbon base material up to a depth of 80 micrometers (μm) to 150 μm×(1.4 to 1.6)−19.5.

14. The method of claim 9, wherein the preparing of the carbon base material comprises:
preparing the carbon base material with an average porosity rate of 15 volume percentage (vol %) to 20 vol %.

15. The method of claim 9, wherein the preparing of the carbon base material comprises:
preparing the carbon base material with a thermal expansion coefficient of $7.0 \times 10^{-6}$/K to $7.5 \times 10^{-6}$/K.

* * * * *